United States Patent
Lee

(10) Patent No.: US 10,397,669 B2
(45) Date of Patent: Aug. 27, 2019

(54) WIRELESS CHECKING SYSTEM OF SWITCH AND OPERATING UNIT PROVIDED IN VEHICLE AND WIRELESS CHECKING METHOD USING THE SAME

(71) Applicant: HYUNDAI MOTOR COMPANY, Seoul (KR)

(72) Inventor: Sung Wook Lee, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 273 days.

(21) Appl. No.: 15/265,985

(22) Filed: Sep. 15, 2016

(65) Prior Publication Data
US 2017/0232910 A1    Aug. 17, 2017

(30) Foreign Application Priority Data
Feb. 11, 2016    (KR) .......................... 10-2016-0015616

(51) Int. Cl.
*H04Q 9/00*    (2006.01)
*H01H 47/00*    (2006.01)

(52) U.S. Cl.
CPC ............ *H04Q 9/00* (2013.01); *H01H 47/002* (2013.01); *H04Q 2209/40* (2013.01); *H04Q 2209/88* (2013.01)

(58) Field of Classification Search
CPC .. H04Q 9/00; H04Q 2209/40; H04Q 2209/88; H01H 47/002; G07C 9/00; G08B 13/189
USPC ......................................... 701/29.1; 340/5.61
See application file for complete search history.

(56) References Cited

U.S. PATENT DOCUMENTS

| | | | |
|---|---|---|---|
| 9,888,337 B1 * | 2/2018 | Zalewski | ................ H04W 4/70 |
| 2003/0006879 A1 * | 1/2003 | Kang | ................. G07C 9/00309 |
| | | | 340/5.61 |

FOREIGN PATENT DOCUMENTS

| | | |
|---|---|---|
| JP | 2015-510466 A | 4/2015 |
| KR | 10-1459939 B1 | 11/2014 |

* cited by examiner

*Primary Examiner* — Gertrude Arthur Jeanglaude
(74) *Attorney, Agent, or Firm* — Morgan Lewis & Bockius LLP

(57) ABSTRACT

A wireless checking system of a switch and operation unit that are provided in a vehicle includes: a switch disposed at a predetermined location in the vehicle; an operation unit wirelessly connected with the switch and disposed at a predetermined location in the vehicle to be operated by the switch; and a diagnosis equipment wirelessly connected with each of the switch and the operation unit and configured to wirelessly operate the switch and the operation unit, detect an operation state of the switch and the operation unit, and diagnose a wireless connection state of the switch and the operation unit.

11 Claims, 3 Drawing Sheets

WIRELESS CHECKING SYSTEM OF SWITCH AND OPERATING UNIT PROVIDED IN VEHICLE AND WIRELESS CHECKING METHOD USING THE SAME

CROSS-REFERENCE TO RELATED APPLICATION

This application claims priority to and the benefit of Korean Patent Application No. 10-2016-001616 filed in the Korean Intellectual Property Office on Feb. 11, 2016, the entire contents of which are incorporated herein by reference.

TECHNICAL FIELD

The present disclosure relates to a wireless checking system of a switch and an operation unit that are provided in a vehicle that diagnoses a connection state of the switch that is provided in the vehicle and the operation unit that operates by the switch by wireless.

BACKGROUND

Nowadays, in a factory line that assembles a vehicle, in order to determine whether each electrical equipment that is mounted in the vehicle normally operates, a naked eye check in which an operator directly determines by a naked eye whether an actuator (operation unit) of a corresponding electrical equipment normally operates by operating a switch of the corresponding electrical equipment and an operation current check that determines a current value of a spec range when operating an electrical equipment is performed.

In order to perform the operation current check, because an operator is required to connect a current measurement device to a battery by wiring and mount a check equipment to a diagnosis connector and is also required to perform operation of an electrical equipment and determine a current value change amount, an operation current check time of the electrical equipment is taken so long and thus an entire electrical equipment is not checked and therefore an electrical equipment quality check before release of the vehicle is not perfectly performed.

In a recently launched vehicle, a switch and an operation unit are wirelessly connected by, and in order to check them, various checking methods are required.

Particularly, in a vehicle in which a switch and an operation unit are wirelessly connected by, in order to perform an engagement check, a wire or wireless connector is installed inside of the vehicle, and by transmitting data to a check equipment that is installed outside the vehicle, a connection state of the switch and the operation unit is diagnosed.

The above information disclosed in this Background section is only for enhancement of understanding of the background of the disclosure and therefore it may contain information that does not form the prior art that is already known in this country to a person of ordinary skill in the art.

SUMMARY

The present disclosure has been made in an effort to provide a wireless checking system of a switch and an operation unit that are provided in a vehicle having advantages of being capable of more effectively diagnosing a wireless connection state between the switch and the operation unit in a state in which the switch that is installed in the vehicle and the operation unit that operates by the switch are wirelessly connected.

An exemplary embodiment of the present disclosure provides a wireless checking system of a switch and an operation unit that are provided in a vehicle including: a switch disposed at a predetermined location in the vehicle; an operation unit wirelessly connected with the switch and disposed at a predetermined location in the vehicle to be operated by the switch; and a diagnosis equipment wirelessly connected with each of the switch and the operation unit and configured to wirelessly operate the switch and the operation unit, detect an operation state of the switch and the operation unit, and diagnose a wireless connection state of the switch and the operation unit.

The wireless checking system may further include a switch controller that detects a current that is generated in the switch and that generates a current detection result signal and an operation controller that that detects a current that is generated in the operation unit and that generates a current detection result signal.

The wireless checking system may further include: a switch wireless communication unit that is connected with the switch controller; an operation wireless communication unit that is connected with the operation controller; and a diagnosis wireless communication unit that is connected with the diagnosis equipment. The switch controller, the operation controller, and the diagnosis equipment may transmit and receive a wireless signal through the switch wireless communication unit, the operation wireless communication unit, and the diagnosis wireless communication unit.

The diagnosis equipment may transmit a check request signal to the switch wireless communication unit and the operation wireless communication unit through the diagnosis wireless communication unit, the switch controller may operate the switch according to a check request signal that is received through the switch wireless communication unit, detect a current that is generated in the switch, and generate a current detection result signal, and the operation controller may operate the operation unit according to a check request signal that is received through the operation wireless communication unit, detect a current that is generated in the operation unit, and generate a current detection result signal.

The diagnosis equipment may diagnose an operation state of the switch and the operation unit according to the current detection result signal that is generated by the switch controller and the current detection result signal that is generated by the operation controller and diagnose a wireless connection state of the switch and the operation unit.

The switch may include at least two of first and second switches, and the operation unit may include at least two of first and second operation units.

The wireless checking system may further include a power supply that supplies power to the switch controller and the operation controller.

Another embodiment of the present disclosure provides a wireless checking method of a switch and an operation unit that are provided in a vehicle including: generating, by a diagnosis equipment, a check request signal; operating, by a switch controller that is provided in the vehicle, a switch according to the check request signal; operating, by an operation controller that is provided in the vehicle, an operation unit corresponding to the switch according to the check request signal; and diagnosing a wireless connection state of the switch and the operation unit by detecting that the operation unit corresponding to the switch operates.

The wireless checking method may further include: detecting, by the switch controller, a current that is generated in the switch and generating a current detection result signal; and detecting, by the operation controller, a current that is generated in the operation unit and generating a current detection result signal.

The diagnosis equipment may receive a current detection result signal that is generated by the switch controller and a current detection result signal that is generated by the operation controller by wireless, diagnose each of operation states of the switch and the operation unit using the current detection result signals, and diagnose a wireless connection state of the switch and the operation unit.

The switch may include at least two switches, and the operation unit may include at least two operation units, and the switch controller may select one of switches according to the check request signal, and the operation controller may select one of operation units according to the check request signal.

The wireless checking method may further include a power supply that supplies power to the switch controller and the operation controller.

According to the present disclosure for achieving such an object, a connection state of a switch and an operation unit that are connected by wireless can be effectively diagnosed using a wireless diagnosis equipment.

That is, the diagnosis equipment may determine whether the switch and the operation unit are normally connected by wireless according to a current detection result signal of the switch and a current detection result signal of the operation unit.

Further, the diagnosis equipment can remotely and effectively check operation of the switch and operation of the operation unit.

DETAILED DESCRIPTION

Figure 1:
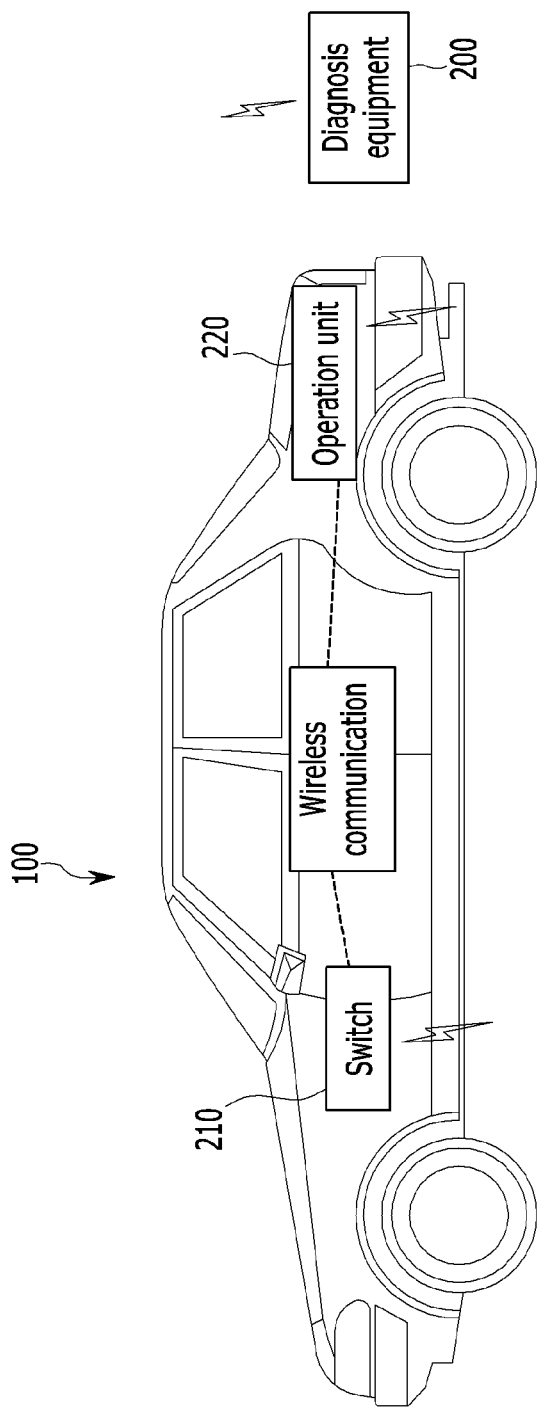
FIG. 1 is a schematic diagram illustrating a switch and an operation unit that are provided in a vehicle according to an exemplary embodiment of the present disclosure.

Hereinafter, an exemplary embodiment of the present disclosure will be described in detail with reference to the accompanying drawings.

Further, in the drawings, a size and thickness of each element are randomly represented for better understanding and ease of description, and the present disclosure is not limited thereto and the thickness of several portions and areas are exaggerated for clarity.

The drawings and description are to be regarded as illustrative in nature and not restrictive. Like reference numerals designate like elements throughout the specification.

In the following description, terms such as a first and a second used in names of constituent elements are used for distinguishing constituent elements having the same name and do not limit order thereof.

FIG. 1 is a schematic diagram illustrating a switch and an operation unit that are provided in a vehicle according to an exemplary embodiment of the present disclosure.

Referring to FIG. 1, a vehicle includes a switch 210 and an operation unit 220 that are connected through wireless communication. The switch 210 may be used for turning on/off a lamp, and the operation unit 220 may be the lamp that is turned on/off by the switch 210.

In a state in which the switch 210 and the operation unit 220 are connected by wire, an operator may manually turn on/off the switch and check an on/off state of the operation unit 220 and thus work efficiency may be deteriorated.

By connecting a separate wire connector (not shown) to an external diagnosis equipment, a connection state of the switch 210 and the operation unit 220 may be checked. Since the wire connector should be used, a limitation may exist in checking a connection of the switch 210 and the operation unit 220 that are wirelessly connected.

In the present disclosure, in a vehicle in which the switch 210 and the operation unit 220 are wirelessly connected, an operation state of the switch 210 and the operation unit 220 and a wireless connection state thereof may be effectively diagnosed using a wireless diagnosis equipment 200 that is installed outside of the vehicle 100.

Figure 2:
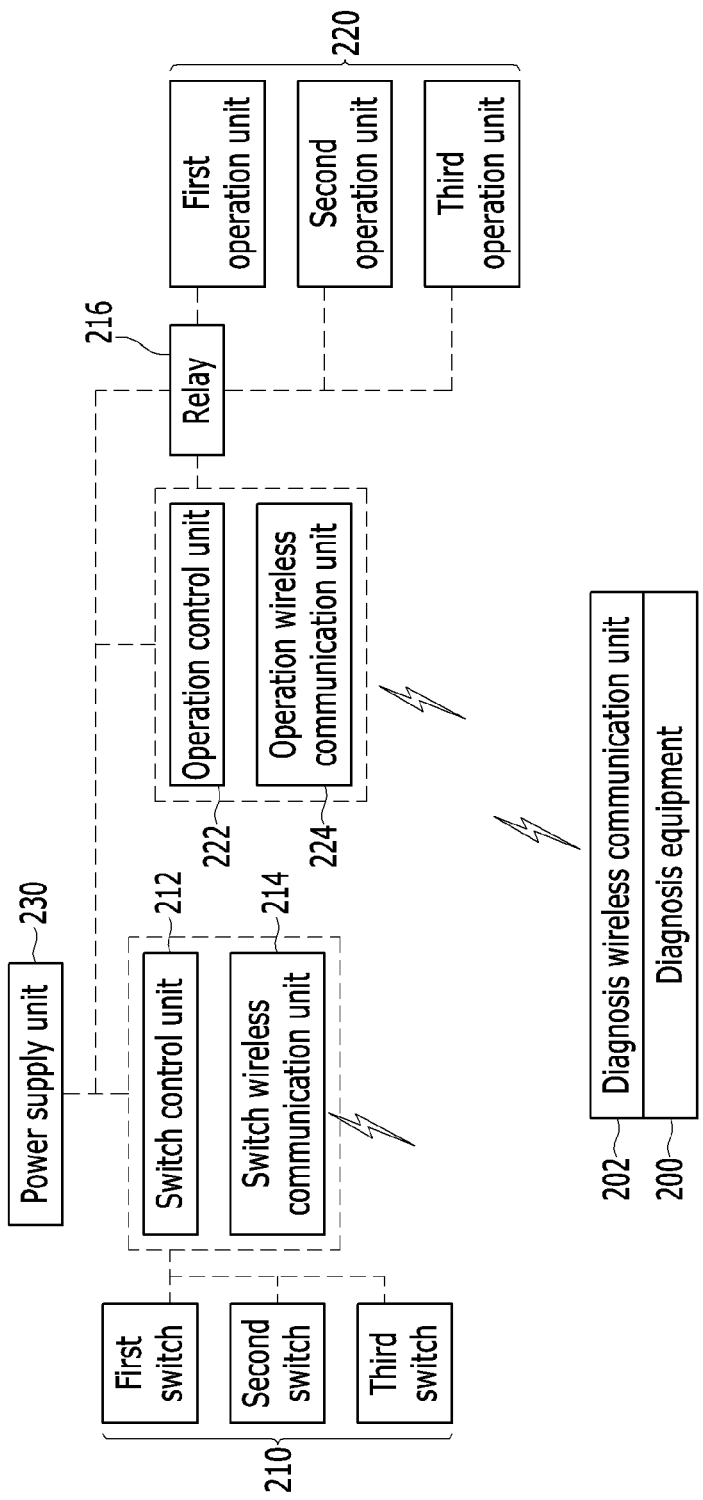
FIG. 2 is a block diagram illustrating a configuration of a wireless checking system of a switch and an operation unit that are provided in a vehicle according to an exemplary embodiment of the present disclosure.

FIG. 2 is a block diagram illustrating a configuration of a wireless checking system of a switch and an operation unit that are provided in a vehicle according to an exemplary embodiment of the present disclosure.

Referring to FIG. 2, the switch 210 includes a first switch, a second switch, and a third switch, a switch controller 212 is disposed to control operation of the first, second, and third switches and detects a current occurring in the first, second, and third switches, and a switch wireless communication unit 214 wirelessly transmits a current detection result signal to the outside.

The operation unit 220 includes a first operation unit, a second operation unit, and a third operation unit, an operation controller 222 is disposed to control operation of the first, second, and third operation units through a relay 216 and detects a current occurring in the first, second, and third operation units, and an operation wireless communication unit 224 wirelessly transmits a current detection result signal to the outside.

The diagnosis equipment 200 includes a diagnosis wireless communication unit 202 (U-SCAN) and transmits and receives a signal to and from the switch wireless communication unit 214 and the operation wireless communication unit 224.

The diagnosis equipment 200 transmits and receives a signal to and from the switch controller 212 through the diagnosis wireless communication unit 202 and the switch wireless communication unit 214. The switch controller 212 may control operation of the switch 210 according to a check request signal occurring in the diagnosis equipment 200, detect a current occurring in the switch 210, and generate a current detection result signal.

When the diagnosis equipment 200 generates a check request signal corresponding to the first switch, the switch controller 212 may operate the first switch, detect a current according to operation of the first switch, and transmit a first current detection result signal to the outside through the switch wireless communication unit 214. The diagnosis equipment 200 may diagnose operation of the first switch according to the first current detection result signal.

Further, when the diagnosis equipment 200 generates a check request signal corresponding to the first operation unit, the operation controller 222 operates the first operation unit through the relay 216. The operation controller 222 may detect a current occurring in the second operation unit according to operation of the first operation unit and transmit a second current detection result signal to the outside through the operation wireless communication unit 224. The diagnosis equipment 200 may diagnose operation of the first operation unit according to the second current detection result signal.

Further, the diagnosis equipment 200 may detect operation of the operation unit 220 according to operation of the switch 210 to diagnose a wireless connection state of the switch 210 and the operation unit 220.

That is, when the diagnosis equipment 200 generates a first switch check request signal, the switch controller 212 operates the first switch, and the switch wireless communication unit 214 transmits a current detection result signal according to operation of the first switch to the outside.

In a state in which the switch controller 212 and the operation controller 222 are normally connected, the operation controller 222 operates the first operation unit through the relay 216. The operation controller 222 may transmit a current detection result signal according to operation of the first operation unit to the outside through the operation wireless communication unit, and the diagnosis equipment 200 may detect a current detection result signal corresponding to the first operation unit to diagnose a wireless connection state of the first switch and the first operation unit.

The diagnosis equipment 200, the switch controller 212 and the operation controller 222 may each be implemented into at least one microprocessor operating by a predetermined program, and the predetermined program may include a series of instructions for performing a method according to an exemplary embodiment of the present disclosure to be described later.

Figure 3:
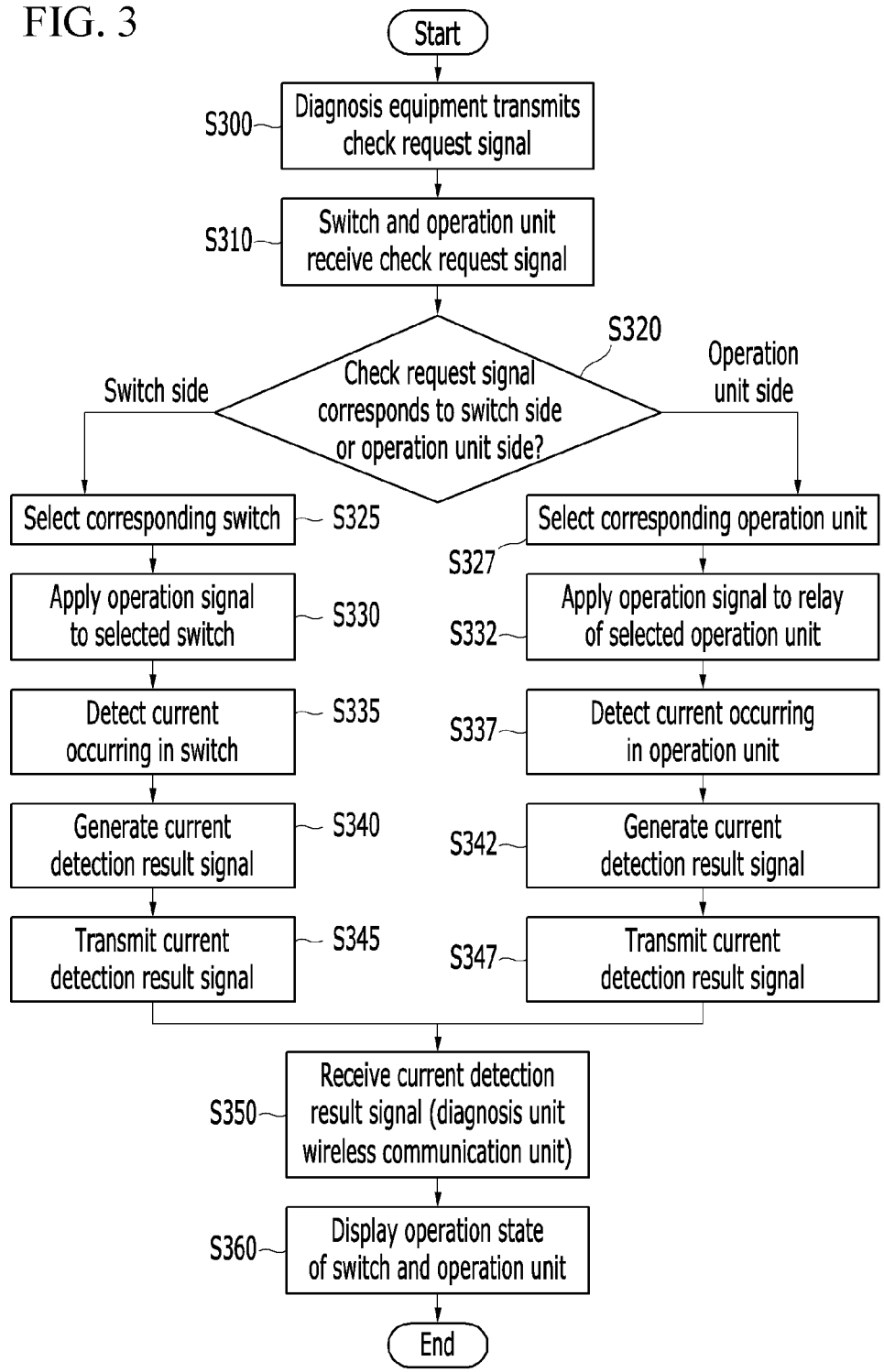
FIG. 3 is a flowchart illustrating a wireless checking method of a switch and an operation unit that are provided in a vehicle according to an exemplary embodiment of the present disclosure.

FIG. 3 is a flowchart illustrating a wireless checking method of a switch and an operation unit that are provided in a vehicle according to an exemplary embodiment of the present disclosure.

Referring to FIG. 3, the diagnosis equipment 200 transmits a check request signal to the outside through the diagnosis wireless communication unit (S300).

The switch wireless communication unit 214 and the operation wireless communication unit 224 receive a check request signal of the diagnosis equipment 200 (S310), and the switch controller 212 and the operation controller 222 determine whether the check request signal corresponds to the switch 210 side or the operation unit 220 side (S320).

If the check request signal corresponds to the switch 210 side, the switch controller 212 selects a corresponding switch among first, second, and third switches (S325).

The switch controller 212 applies an operation signal to the selected switch 210 (S330) and detects a current occurring in the selected switch 210 (S335).

Thereafter, the switch controller 212 generates a first current detection result signal corresponding to the switch 210 (S340), and the switch wireless communication unit 214 transmits the first current detection result signal to the outside (S345).

The diagnosis equipment 200 receives the first current detection result signal of the switch 210 through the diagnosis wireless communication unit 202 (S350), and the diagnosis equipment 200 diagnoses and displays whether operation of the switch 210 is normal or abnormal using the current detection result signal of the switch 210 according to the check request signal (S360).

If the check request signal corresponds to the operation unit 220 side, the operation controller 222 selects a corresponding operation unit among the first, second, and third operation units (S327), and the operation controller 222 applies an operation signal to the selected operation unit 220 (S332) and detects a current occurring in the selected operation unit 220 (S337).

Thereafter, the operation controller 222 generates a second current detection result signal of the operation unit 220 (S342), and the operation wireless communication unit 224 transmits the second current detection result signal of the operation unit 220 to the outside (S347).

The diagnosis equipment 200 receives the second current detection result signal of the operation unit 220 through the diagnosis wireless communication unit 202 (S350), and the diagnosis equipment 200 diagnoses whether operation of the operation unit 220 is normal or abnormal using the current detection result signal of the operation unit 220 according to the check request signal (S360).

Further, the diagnosis equipment 200 determines whether the switch 210 and the operation unit 220 are normally wirelessly connected according to the first current detection result signal of the switch 210 and the second current detection result signal of the operation unit 220 (S360).

That is, in an exemplary embodiment of the present disclosure, the diagnosis equipment 200 may determine that the first operation unit is turned on in a state in which the first switch is turned on, determine whether the second operation unit is turned on in a state in which the second switch is turned on, determine whether the third operation unit is turned on in a state in which the third switch is turned on, and thus diagnose that the switch and the operation unit are normally wirelessly connected.

In order words, in a state in which the switch is turned on, the diagnosis equipment 200 may determine an on state of the operation unit corresponding to the switch to wirelessly diagnose whether the switch and the operation unit are normally connected (i.e., electrically connected).

While this disclosure has been described in connection with what is presently considered to be practical exemplary embodiments, it is to be understood that the disclosure is not limited to the disclosed embodiments. On the contrary, it is intended to cover various modifications and equivalent arrangements included within the spirit and scope of the appended claims.

What is claimed is:

1. A wireless checking system of a switch and an operation unit provided in a vehicle, the wireless checking system comprising:
   a switch disposed at a predetermined location in a vehicle;
   an operation unit wirelessly connected with the switch and disposed in the vehicle, the operation unit being operated by the switch;
   a diagnosis equipment wirelessly connected with each of the switch and the operation unit and configured to wirelessly operate the switch and the operation unit, detect an operation state of the switch and the operation unit, and diagnose a wireless connection state of the switch and the operation unit;
   a switch controller configured to:
      operate the switch according to a check request signal generated in the diagnosis equipment,
      detect a current generated in the switch, and
      generate a first current detection result signal; and
   an operation controller configured to:
      operate the operation unit according to a check request signal generated in the diagnosis equipment,
      detect a current generated in the operation unit, and
      generate a second current detection result signal.

2. The wireless checking system of claim 1, further comprising:
- a switch communication unit communicatively connected with the switch controller;
- an operation communication unit communicatively connected with the operation controller; and
- a diagnosis communication unit communicatively connected with the diagnosis equipment,
- wherein the switch controller, the operation controller, and the diagnosis equipment transmit and receive a wireless signal through the switch communication unit, the operation communication unit, and the diagnosis communication unit.

3. The wireless checking system of claim 2, wherein the diagnosis equipment transmits the check request signal to the switch communication unit and the operation communication unit through the diagnosis communication unit,
- the switch controller operates the switch according to the check request signal that is received through the switch communication unit, and
- the operation controller operates the operation unit according to the check request signal that is received through the operation communication unit.

4. The wireless checking system of claim 3, wherein the diagnosis equipment diagnoses the operation state of the switch and the operation unit according to the first current detection result signal generated by the switch controller and the second current detection result signal generated by the operation controller and diagnoses the wireless connection state of the switch and the operation unit.

5. The wireless checking system of claim 1, wherein the switch comprises at least two switches, and the operation unit comprises at least two operation units and selects each one according to the check request signal.

6. The wireless checking system of claim 1, further comprising a power supply that supplies power to the switch controller unit and the operation controller unit.

7. A wireless checking method of a switch and an operation unit that are provided in a vehicle, the wireless checking method comprising:
- generating, by a diagnosis equipment, a check request signal;
- operating, by a switch controller provided in the vehicle, a switch according to the check request signal from the diagnosis equipment;
- operating, by an operation controller provided in the vehicle, an operation unit corresponding to the switch according to the check request signal from the diagnosis equipment; and
- diagnosing a wireless connection state of the switch and the operation unit by detecting whether the operation unit corresponding to the switch operates.

8. The wireless checking method of claim 7, further comprising:
- detecting, by the switch controller, a current generated in the switch and generating a first current detection result signal; and
- detecting, by the operation controller, a current generated in the operation unit and generating a second current detection result signal.

9. The wireless checking method of claim 8, wherein the diagnosis equipment wirelessly receives the first current detection result signal generated by the switch controller and the second current detection result signal generated by the operation controller, diagnoses each of operation states of the switch and the operation unit using the first and second current detection result signals, and diagnoses a wireless connection state of the switch and the operation unit.

10. The wireless checking method of claim 7, wherein the switch comprises at least two of first and second switches, and the operation unit comprises at least two of first and second operation units, and
- the switch controller selects one of switches according to the check request signal, and the operation controller selects one of operation units according to the check request signal.

11. The wireless checking method of claim 8, further comprising a power supply that supplies power to the switch controller and the operation controller.

* * * * *